United States Patent
Takahashi et al.

(10) Patent No.: US 6,600,203 B2
(45) Date of Patent: Jul. 29, 2003

(54) SEMICONDUCTOR DEVICE WITH SILICON CARBIDE SUPPRESSION LAYER FOR PREVENTING EXTENSION OF MICROPIPE

(75) Inventors: Kunimasa Takahashi, Ibaraki (JP); Toshiya Yokogawa, Nara (JP); Makoto Kitabatake, Nara (JP); Masao Uchida, Ibaraki (JP); Osamu Kusumoto, Nara (JP); Kenya Yamashita, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/127,126

(22) Filed: Apr. 22, 2002

(65) Prior Publication Data
US 2002/0158251 A1 Oct. 31, 2002

(30) Foreign Application Priority Data
Apr. 27, 2001 (JP) ........................................ 2001-131497

(51) Int. Cl.[7] .............................................. H01L 31/00
(52) U.S. Cl. .................. 257/442; 257/629; 257/635; 257/627
(58) Field of Search ......................... 257/93, 627, 629, 257/632, 635, 442

(56) References Cited

U.S. PATENT DOCUMENTS 6,376,900 B1 * 4/2002 Yamada et al. ............. 257/629
2002/0059902 A1 * 5/2002 Vodakov et al. ............ 117/104

OTHER PUBLICATIONS

Sasaki, M. et al.; "Polytype and Defect Control of Two Inch Diameter Bulk SiC"; Trans Tech Publications, Materials Science Forum vols. 338–342 (2000); pp. 485–488; Oct. 1999.

* cited by examiner

Primary Examiner—Carl Whitehead, Jr.
Assistant Examiner—Yennhu Huynh
(74) Attorney, Agent, or Firm—Harness, Dickey & Pierce, PLC

(57) ABSTRACT

A suppression layer is formed on a SiC substrate in accordance with a CVD method which alternately repeats the step of epitaxially growing an undoped layer which is a SiC layer into which an impurity is not introduced and the step of epitaxially growing an impurity doped layer which is a SiC layer into which nitrogen is introduced pulsatively. A sharp concentration profile of nitrogen in the suppression layer prevents the extension of micropipes. A semiconductor device properly using the high breakdown voltage and high-temperature operability of SiC can be formed by depositing SiC layers forming an active region on the suppression layer.

3 Claims, 12 Drawing Sheets

Micropipes

SEMICONDUCTOR DEVICE WITH SILICON CARBIDE SUPPRESSION LAYER FOR PREVENTING EXTENSION OF MICROPIPE

BACKGROUND OF THE INVENTION

1. Field of the Invention

The present invention relates to a semiconductor device and to a method for fabricating the same. More particularly, it relates to a semiconductor device having a SiC layer and to a method for fabricating the same.

2. Description of the Related Art

A silicon carbide (SiC) is a semiconductor having a high breakdown field because of its band gap larger than that of silicon (Si) and stable even at a high temperature. For this reason, applications of SiC to power devices, RF devices, and high-temperature operating devices in the next generation have been expected. Crystals of SiC fall into a plurality of types including cubic 3C-SiC, hexagonal 6H-SiC and 4H-SiC, and rhombohedral 15R-SiC. Of the foregoing types, 6H-SiC and 4H-SiC have been used commonly to fabricate a practical SiC semiconductor device. On the other hand, a substrate having, as a principal surface, a surface substantially coincident with the (0001) plane perpendicular to the crystal axis has been used widely.

FIG. 11 is a cross-sectional view of a conventional vertical apparatus for growing a SiC thin film. As shown in the drawing, the conventional vertical apparatus for growing a SiC thin film is composed of: a reactor 100; a gas supply system 107; a gas exhaust system 111; and a coil 103 for heating a sample. A doping gas 106 is supplied to an upper inner portion of the reactor 100 from the gas supply system 107 through a pipe. A raw material gas 104 and a diluent gas 105 transported from the gas supply system 107 through different pipes are mixed with each other and supplied to the upper inner portion of the reactor 100. The pipes for supplying the raw material gas 104, the diluent gas 105, and the doping gas 106 to the reactor 100 are provided with respective flow meters 108, 109, and 110 for controlling flow rates. The reactor 100 is internally provided with a support shaft 114 extending vertically from the lower surface of the reactor 100 and a susceptor 101 supported by the support shaft 114. The raw material gas 104, the diluent gas 105, and the doping gas 106 are introduced into the reactor 100 and then exhausted therefrom via the gas exhaust system 111, as indicated by an arrow 112. The pressure in the reactor 100 is controlled via a valve 113. The susceptor 101 supported by the support shaft 114 is heated by RF induction heating using a coil 103 wound around the reactor 100. A cooling water is circulated in the peripheral portion 115 of the reactor 100.

A SiC crystal layer has been formed conventionally by a CVD method using the foregoing apparatus for growing a thin film. The following is the procedure for forming the SiC crystal layer.

First, a SiC substrate 102 is placed on the susceptor 101 in the reactor 100. Then, a hydrogen gas is introduced into the reactor 100 from the upper portion thereof and the pressure in the reactor is adjusted to a value equal to or lower than an atmospheric pressure. Under the condition, an RF power is applied to the coil 103 to heat the substrate 102 such that the substrate temperature is maintained at 1500° C. or more.

Subsequently, a carbon containing gas (such as propane) and a silicon containing gas (such as silane) are introduced to allow the growth of a SiC crystal on the surface of the substrate 102.

In the case of forming a doped layer, a doping gas 106 (which is, e.g., nitrogen if an n-type doped layer is to be formed or aluminum if a p-type doped layer is to be formed) is supplied from the gas supply system 107 into the reactor 100 from the upper portion thereof through the flow meter 110.

After the completion of the crystal growth, the supply of the raw material gas 104 is stopped and the application of the RF power to the coil 103 is stopped, whereby the heating is terminated and the substrate 102 is cooled. As a result, a SiC crystal layer is formed on the SiC substrate.

FIG. 12 shows a process in which the respective flow rates of a raw material gas and a diluent gas and the temperature of a substrate vary with time in accordance with the conventional method for growing a SiC crystal layer. The supply of the diluent gas is initiated, while the substrate is heated. The raw material gas is supplied after the substrate temperature reaches a desired level.

In a SiC wafer, defects termed "micropipes" which extend through the substrate exist. Therefore, it cannot be said that the whole wafer has an excellent crystalline property. Although studies have been made to reduce the micropipe defects in the SiC wafer, it is difficult with current technologies to prevent the occurrence of the micropipe defects in the SiC wafer.

When a semiconductor device is fabricated by using the wafer as a substrate with the conventional technologies, the micropipe defects in the substrate extend disadvantageously into the SiC thin film grown on the substrate by thermal chemical vapor deposition (CVD), thereby degrading the crystalline property. Even if the device is fabricated by using SiC for a substrate, it has been difficult to provide characteristics which can be expected from the excellent physical properties of SiC, including high-temperature operability and a high breakdown voltage.

SUMMARY OF THE INVENTION

It is therefore an object of the present invention to provide means for preventing micropipe defects in a substrate from extending into a SiC film and thereby allow the fabrication of a semiconductor device properly using the high-temperature operability and high breakdown voltage of SiC.

A semiconductor device according to the present invention comprises: a SiC substrate; a suppression layer formed on the SiC substrate, the suppression layer including at least one high-concentration SiC layer containing an impurity at a high concentration and having the function of preventing extension of a micropipe; and an active region formed on the suppression layer.

In the arrangement, the suppression layer prevents the upward growth of micropipe defects contained in the SiC substrate so that the density of the micropipe defects in the active region is lowered. This improves the characteristics of the semiconductor device including a breakdown voltage and high-temperature operability.

The suppression layer further includes: at least one low-concentration SiC layer containing an impurity at a concentration lower than in the high-concentration SiC layer and the high-concentration SiC layer and the low-concentration SiC layer are formed in alternately stacked relation. The arrangement causes a sharp change in impurity concentration between the high-concentration SiC layer and the low-concentration SiC layer and more effectively prevents the growth of the micropipe.

The active region includes: at least one first SiC layer functioning as a carrier flow region; and at least one second SiC layer containing an impurity for carriers at a concentration higher than in the first SiC layer, smaller in thickness than the first SiC layer, and allowing the carriers to be spread out into the first SiC layer under a quantum effect and the first SiC layer and the second SiC layer are formed in alternately stacked relation. The arrangement increases the mobility of the carriers in the active region and further improves the performance of the semiconductor device.

A method for fabricating a semiconductor device according to the present invention is a method for fabricating a semiconductor device comprising a suppression layer provided on a SiC substrate to prevent extension of a micropipe and an active region provided on the suppression layer, the method comprising: at least one suppression-layer forming step performed in accordance with a CVD method of epitaxially growing a high-concentration SiC layer, while pulsatively introducing an impurity.

In accordance with the method, the suppression layer prevents the upward growth of micropipe defects contained in the SiC substrate so that the density of the micropipe defects in the active region is lowered. This improves the characteristics of the semiconductor device including a breakdown voltage and high-temperature operability.

The suppression-layer forming step includes the step of: epitaxially growing a low-concentration SiC layer containing an impurity at a concentration lower than in the high-concentration SiC layer without introducing the impurity and the suppression-layer forming step is performed by alternately repeating the step of forming the high-concentration SiC layer and the step of forming the low-concentration SiC layer at least once.

The method causes a sharp change in the impurity concentration of the suppression layer and allows the formation of the suppressing which effectively prevents the growth of the micropipe defects. The micropipe defects disturb the crystalline structure therearound and thereby degrades the performance of the semiconductor device or lowers a production yield in the process of fabricating the semiconductor device. By suppressing the growth of the micropipe defects, therefore, the method allows the fabrication of a semiconductor device properly using a high breakdown voltage and high-temperature operability inherent in SiC and increases the production yield of the semiconductor device.

In the method according to the present invention, the impurity is one selected from the group consisting of nitrogen (N), phosphorus (P), aluminum (Al), boron (B), and neon (Ne). This allows the selected one of the elements to enter the lattice of a SiC crystal or enter an interstitial space and thereby effectively suppresses the growth of the micropipe defects.

DETAILED DESCRIPTION OF THE INVENTION

Figure 7:
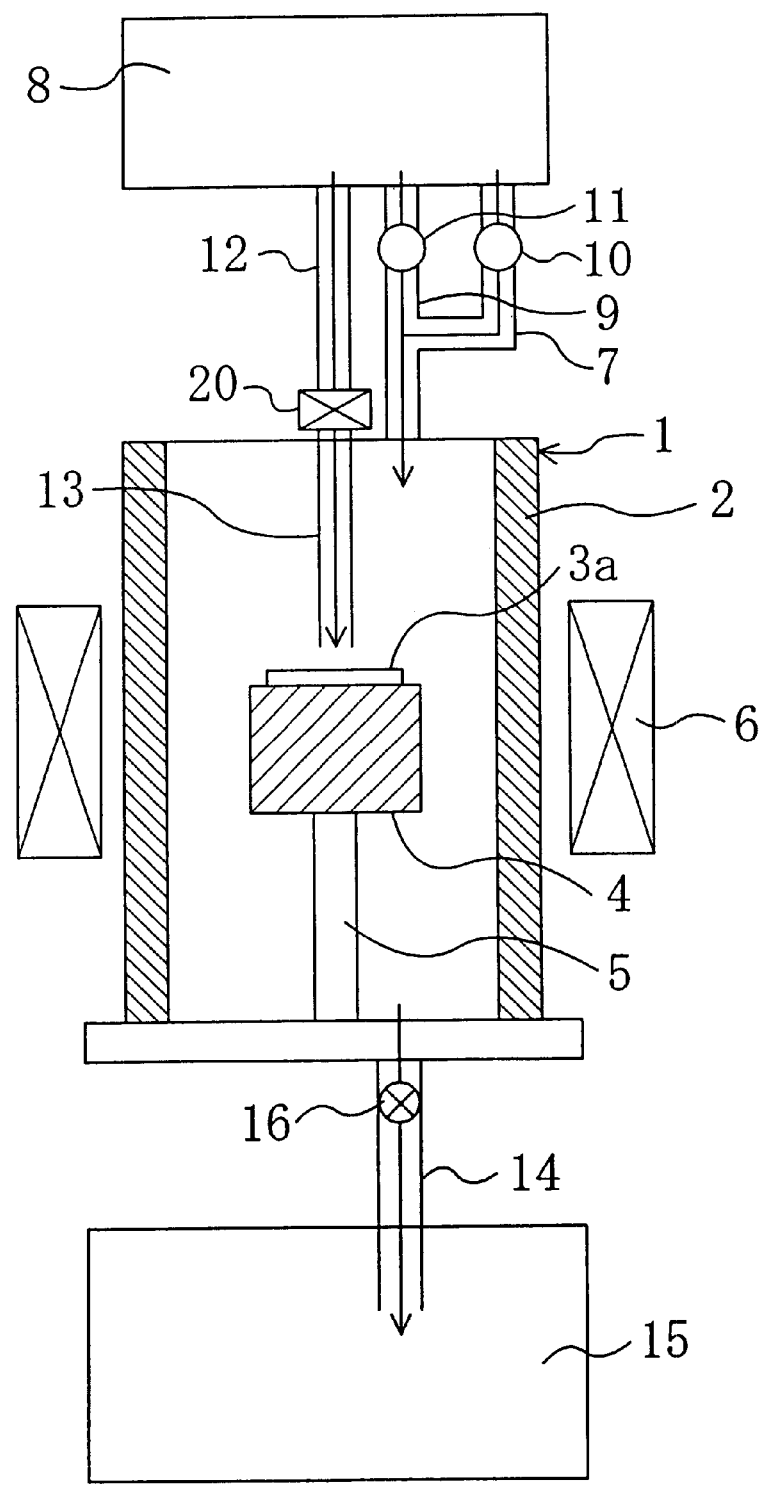
FIG. 7 schematically shows an apparatus for growing a SiC thin film which is capable of impurity pulse doping used in the present invention.

FIG. 7 schematically shows a structure of a vertical crystal growing apparatus used to grow a SiC film in each of the embodiments of the present invention. As shown in the drawing, the vertical crystal growing apparatus comprises; a reactor 1 internally provided with a carbon susceptor 4 for carrying a substrate 3a and a support shaft 5 for supporting the susceptor 4; a quartz tube 2 composing the reactor 1; and a coil 6 for inductively heating the susceptor 4 with an RF current. The quartz tube 2 is composed of a double quartz tube or the like and configured to allow the passage of a cooling water therethrough. There are also provided: a gas supply system 8 in which respective cylinders containing different gases to be supplied to the reactor 1 and the like are disposed; and a gas exhaust system 15 in which a vacuum pump for exhausting the different gases from the reactor 1 and the like are disposed. The gas supply system 8 and the reactor 1 are connected to each other via a raw material gas supply pipe 7 for supplying a raw material gas, a diluent gas supply pipe 9 for supplying a diluent gas such as hydrogen, and an additive gas supply pipe 12 for supplying additive gases such as an inert gas and a doping gas. The raw material gas supply pipe 7 and the diluent gas supply pipe 9 are joined midway to be connected to the reactor 1. Flow meters 10 and 11 for controlling flow rates are provided in intervening relation in the respective portions of the raw material gas supply pipe 7 and the diluent gas supply pipe 9 anterior to the joint therebetween. The gas exhaust system 15 and the reactor 1 are connected to each other via the exhaust pipe 14. A pressure control valve 16 for controlling the pressure in the reactor 1 by adjusting the flow rate of the exhausted gas is provided in intervening relation in the exhaust pipe 14.

The crystal growing apparatus is characterized in that a pulse valve 20 is provided in intervening relation in the additive gas supply pipe 12 and that a gas inlet pipe 13 with a diameter of about 2 cm extends in the reactor 1 from the tip of the additive gas supply pipe 12 and the tip of the gas inlet pipe 13 opens at a position about 5 cm above the upper surface of the substrate 3a.

The susceptor 4 is coated with a SiC film with a thickness of about 100 µm such that degassing does not occur when it is heated to a high temperature. The thickness of the SiC film is not particularly limited provided that it is larger than a thickness which can prevent the occurrence of degassing.

In the apparatus, the raw material gas and the diluent gas supplied from the gas supply system 8 through the raw material gas supply pipe 7 and the diluent gas supply pipe 9, respectively, are joined to be introduced into the reactor 1 from the upper portion thereof.

At that time, the respective flow rates of the raw material gas and the diluent gas are controlled by the flow meters 10 and 11.

The additive gases such as the doping gas and the inert gas supplied via the additive gas supply pipe 12 are supplied pulsatively to the surface of the substrate 3a by the periodical opening and closing of the pulse valve 20. The period (pulse width) during which the pulse valve 20 is opened and the period (pulse-to-pulse interval) during which the pulse valve 20 is closed can be determined arbitrarily. If the period during which the pulse valve 20 is opened is 100 µs and the period during which the pulse valve 20 is closed is 4 ms, e.g., the opening and closing of the pulse valve 20 is repeated about 240 times per second. The tip of the gas inlet pipe 13 and the substrate 3a are preferably in close proximity but, if they are in excessively close proximity, an effect achieved by pulsatively supplying the gases can be exerted only within a limited range so that a distance of about 5 cm is preferably kept therebetween.

The raw material gas, the diluent gas, and the additive gases pass through the exhaust pipe 14 to be exhausted to the outside by the gas exhaust system 15.

Embodiment 1

A description will be given herein below to a Schottky diode according to a first embodiment of the present invention.

Figure 1:
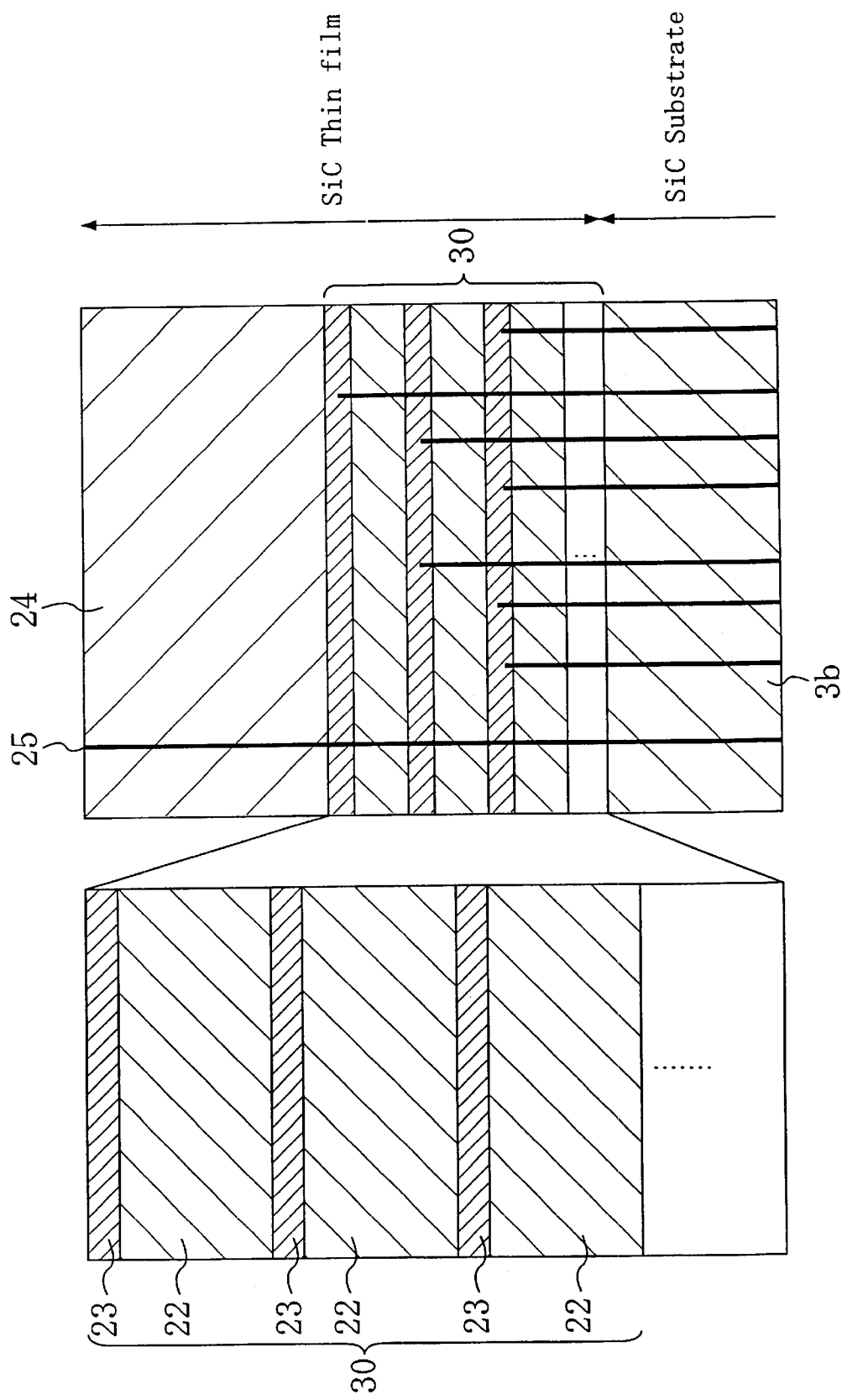
FIG. 1 is a cross-sectional view of a SiC substrate having a SiC thin film formed in accordance with a method for growing a SiC thin film according to a first embodiment of the present invention.

FIG. 1 is a cross-sectional view of a SiC substrate used for the Schottky diode according to the first embodiment.

As shown in the drawing, the SiC substrate used for the Schottky diode according to the present embodiment comprises: a base substrate 3b; a suppression layer 30 composed of a multilayer structure consisting of five undoped layers (low-concentration SiC layers) 22 each made of SiC and having a thickness of 100 nm and five impurity doped layers (high-concentration SiC layers) 23 each made of SiC containing nitrogen at a concentration higher than in the undoped layers 22 and having a thickness of 20 nm, which are formed in alternately stacked relation on the base substrate 3b; and an undoped SiC layer 24 made of SiC formed on the suppression layer 30 and having a thickness of 3 µm.

The base substrate 3b contains micropipe defects at a density of about 100/cm².

Some of the micropipe defects 25 have extended through the suppression layer 30 and reached the undoped SiC layer 24.

Figure 2:
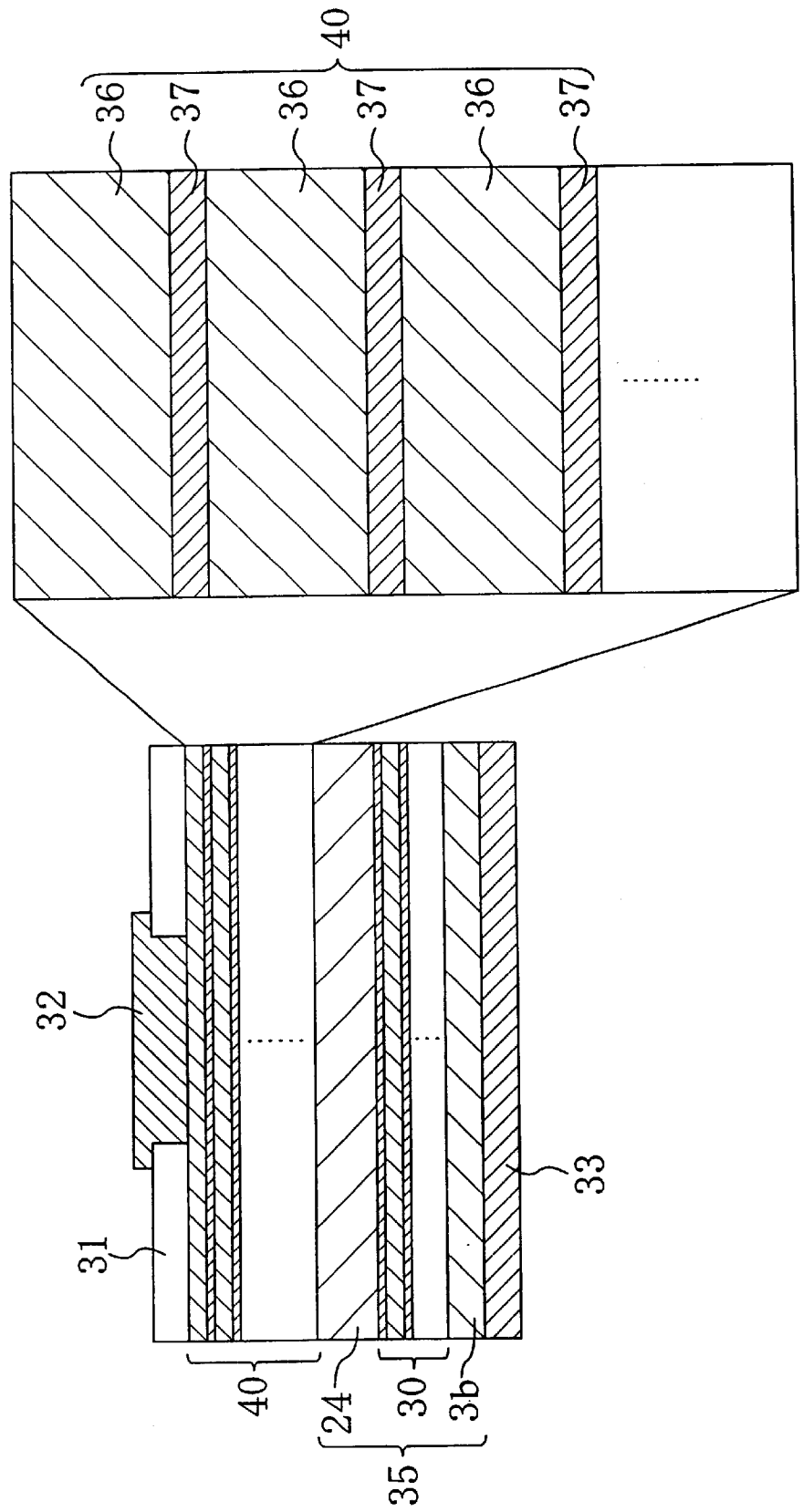
FIG. 2 is a cross-sectional view of a Schottky diode according to the first embodiment.

FIG. 2 is a schematic cross-sectional view of the Schottky diode as a power semiconductor device according to the present embodiment. The present embodiment uses a substrate composed of the base substrate 3b, the suppression layer 30 having the function of preventing the extension of the micropipe defects 25, and the undoped SiC layer 24 each provided on the base substrate 3b. Hereinafter, the substrate will be referred to as a substrate 35 for device.

As shown in FIG. 2, an active region 40 composed of fifty undoped layers 36 and fifty n-type doped layers 37 (δ-doped layers) which are formed in alternately stacked relation in accordance with the following method is provided on the principal surface of the substrate 35 for device which is a 4H-SiC substrate. The thickness of the substrate 35 for device is about 100 µm. The thickness of each of the n-type doped layers 37 is about 10 nm. The peak concentration of nitrogen in the n-type doped layer 37 is $1\times10^{18}$ atoms cm$^{-3}$. The thickness of the entire active region 40 is about 3000 nm (3 µm). The uppermost portion of the active region 40 is composed of the undoped layer 36. A guard ring 31 made of a silicon dioxide film and a Schottky electrode 32 made of a Ni alloy in Schottky contact with the uppermost undoped layer 36 of the active region 40 through the opening formed in the guard ring 31 are provided on the uppermost undoped layer 36 of the active region 40. On the other hand, an ohmic electrode 33 made of a Ni alloy in ohmic contact with the substrate 35 for device is provided on the back surface of the substrate 35 for device. It is sufficient for the ohmic electrode 33 to make contact with any part of the substrate 35 for device. The ohmic electrode 33 may also make contact with the side surface of the substrate 35 for device.

A description will be given next to a method for fabricating the Schottky diode according to the first embodiment.

As the base substrate 3b, an n-type (0001)-plane SiC (4H-SiC) substrate having a diameter of 50 mm and the (0001) plane inclined at an angle of 8° in the [11-20] direction was used. As a result of observing the surface of the base substrate 3b, the micropipe defects 25 were found at a density of about 100/cm².

First, the base substrate 3b was placed in a water vapor atmosphere through which oxygen had been bubbled at a flow rate of 5 (L/min) and subjected to a thermal oxidation process performed at 1100° C. for about 3 hours, whereby a thermal oxidation film with a thickness of about 40 nm (400 Å) was formed on the surface of the base substrate 3b. Then, the thermal oxidation film was removed with a buffered hydrofluoric acid (hydrofluoric acid: aqueous ammonium fluoride solution=1:7). Thereafter, the base substrate 3b from which the thermal oxidation film had been removed was placed on the susceptor 4 and the reactor 1 was exhausted till a degree of vacuum reaches about $1\times10^{-6}$ Pa($\approx 1\times10^{-8}$ Torr).

Then, a hydrogen gas and an argon gas were supplied from the gas supply system 8 at a flow rate of 2 (L/min) and at a flow rate of 1 (L/min), respectively, thereby adjusting the pressure in the reactor 1 to $9.3\times10^4$ Pa ($7\times10^2$ Torr). The pressure in the reactor 1 was controlled by adjusting the valve 16. An RF power of 20.0 kHz and 20 kW was applied to the coil 6 by using an induction heating apparatus, while the foregoing flow rates were maintained, thereby heating the susceptor 4. The temperature of the base substrate 3b was held constantly at 1600° C.

Then, a propane gas as the raw material gas of carbon (C) and a silane gas as the raw material gas of silicon (Si) were supplied at a flow rate of 2 (mL/min) and at a flow rate of 3 (mL/min), respectively, from the gas inlet port of the reactor 1, while the respective flow rates of the hydrogen gas and the argon gas were maintained at 2 (L/min) and 1 (L/min), respectively. Each of the raw material gases was diluted with a hydrogen gas at a flow rate of 50 (mL/min) and supplied. By supplying the propane gas and the silane gas to the base material 3b on the heated susceptor 4 at the foregoing flow rates, a thin film of a 4H-SiC crystal (undoped layer 22; low-concentration doped layer) undoped with an impurity was grown epitaxially on the base substrate 3b to a thickness of about 100 nm. Even if a nitrogen gas or the like is not used, an impurity for carriers, such as nitrogen, may be introduced to a certain extent from a residual gas or the like so that the present embodiment and each of the following embodiments uses the term "undoped" in the sense that the step of introducing nitrogen is not performed during the formation of the thin film in the fabrication process.

Subsequently, nitrogen as an impurity doping gas was introduced, while the respective flow rates of the propane gas, the silane gas, and the hydrogen gas were maintained, whereby the impurity doped layer 23 (high-concentration doped layer) with a thickness of about 20 nm was formed on the undoped layer 22. The thickness of the impurity doped layer 23 was controlled by adjusting the time during which the pulse valve 1 was operated. In the present embodiment, the time during which the pulse valve 1 was opened was adjusted to 102 μs, while the time during which the pulse valve 1 was closed was adjusted to 4 ms. It was proved by secondary ion mass spectroscopy (SIMS) that the impurity concentration under these conditions was $1 \times 10^{18}$ atoms $cm^{-3}$.

Subsequently, the undoped layer 22 with a thickness of about 100 nm was grown on the impurity doped layer 23 in the state in which the operation of the pulse valve was halted. Then, the impurity doped layer 23 was formed on the undoped layer 22 by operating again the pulse valve under the foregoing conditions. Thereafter, the steps of forming the undoped layer 22 and the impurity doped layer 23 were repeated in the same manner, thereby alternately forming five impurity doped layers 23 each having a thickness of about 20 nm and five undoped layers 22 each having a thickness of about 100 nm. The portion composed of a multilayer structure consisting of the undoped layers 22 and the impurity doped layers 23 is designated as the suppression layer 30.

Then, the undoped SiC layer 24 having a thickness of about 3 μm and into which the impurity had not been introduced was formed on the suppression layer 30 by using the foregoing crystal growing apparatus, whereby the SiC substrate having the SiC thin film to be used for the Schottky diode according to the present embodiment was fabricated.

Figure 9:
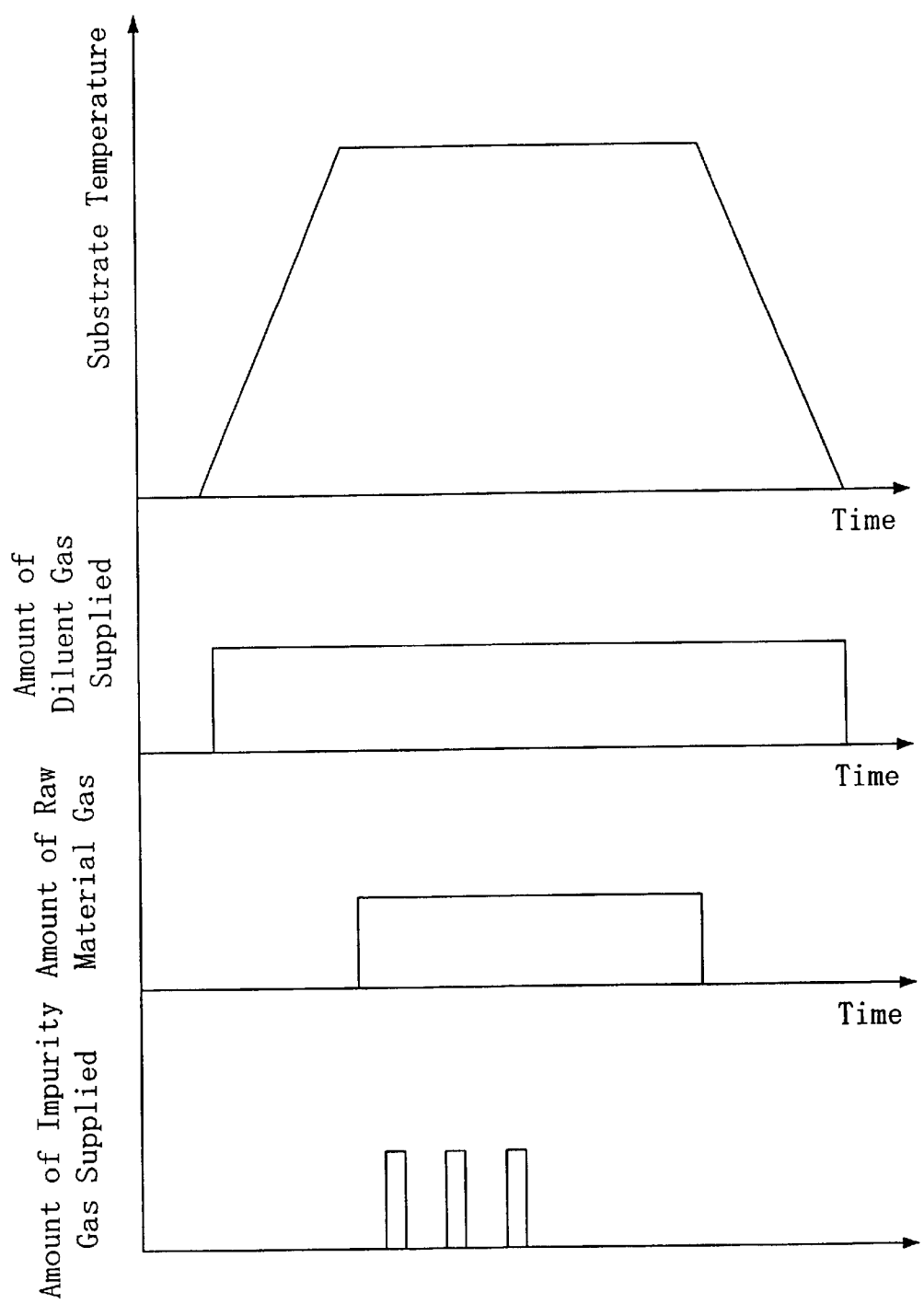
FIG. 9 shows a process in which the respective flow rates of an impurity containing gas, raw material gases, and a diluent gas and the temperature of a substrate vary with time when a multilayer structure composed of the impurity doped layers and the undoped layers is formed in accordance with a method for growing a SiC thin film used in the first embodiment.

FIG. 9 shows a process in which the respective flow rates of the gas containing the impurity (nitrogen), the raw material gases (the propane gas and the silane gas), and the diluent gas (the hydrogen gas) and the temperature of the substrate vary with time when the impurity doped layers and the undoped layers are formed alternately to provide the multilayer structure in accordance with a method for growing a SiC thin film. It can be seen from the drawing that, in the process of growing a SiC crystal, the supply of the diluent gas is initiated, while the substrate temperature is raised, so that a fixed amount of supply is held. After the substrate temperature reaches about 1600° C., the supply of the raw material gases is initiated. Thereafter, the gas containing the impurity is supplied pulsatively.

The concentrations of the impurity contained in the SiC thin film formed by the method were measured by SIMS along the depth of the SiC thin film.

Figure 8:
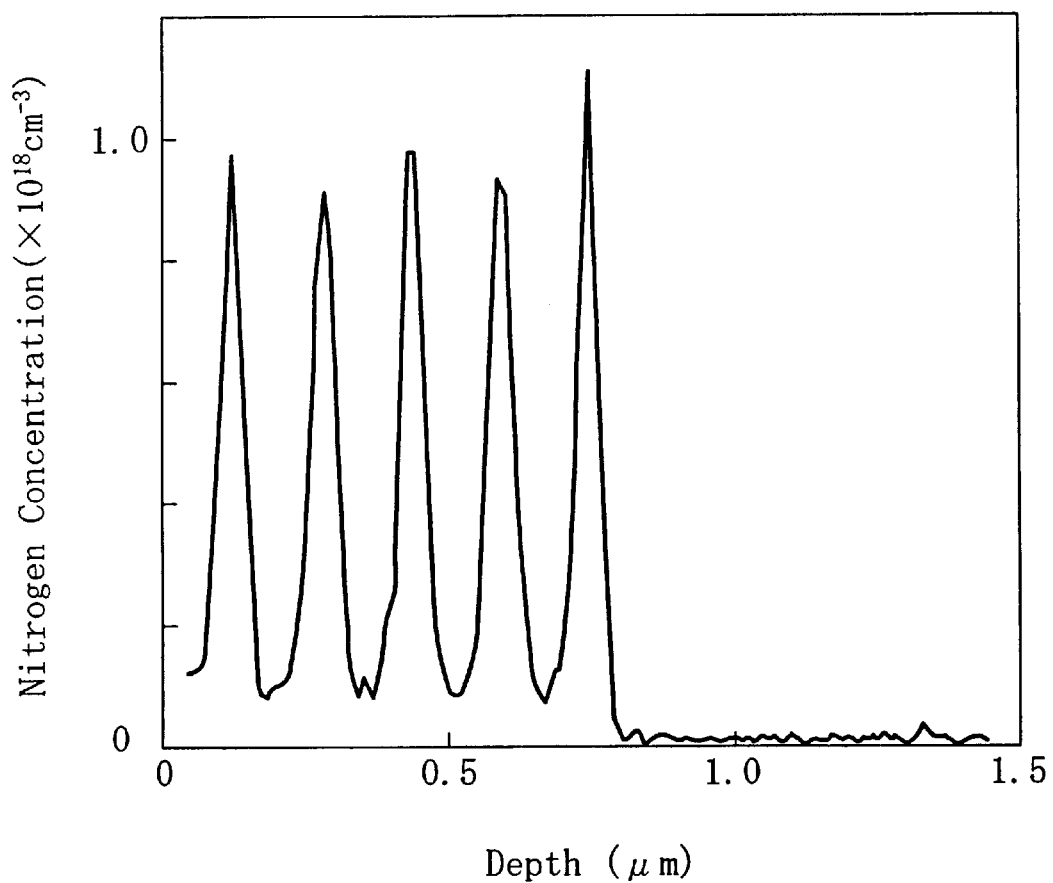
FIG. 8 shows nitrogen concentrations in a suppression layer composed of impurity doped layers and undoped layers, which are plotted versus the depth thereof according to the first embodiment.

FIG. 8 shows the nitrogen concentrations in the SiC thin film measured by SIMS, which were plotted versus the depth thereof. The measurement was conducted under the conditions that the time during which the pulse valve 20 was opened was 102 μs and the time during which the pulse valve 20 was closed was 4 ms. From the drawing, it will be understood that the nitrogen concentration in each of the impurity doped layers formed in the present embodiment varied extremely sharply in the portion thereof adjacent the boundary between itself and the undoped layer.

Figure 10A:
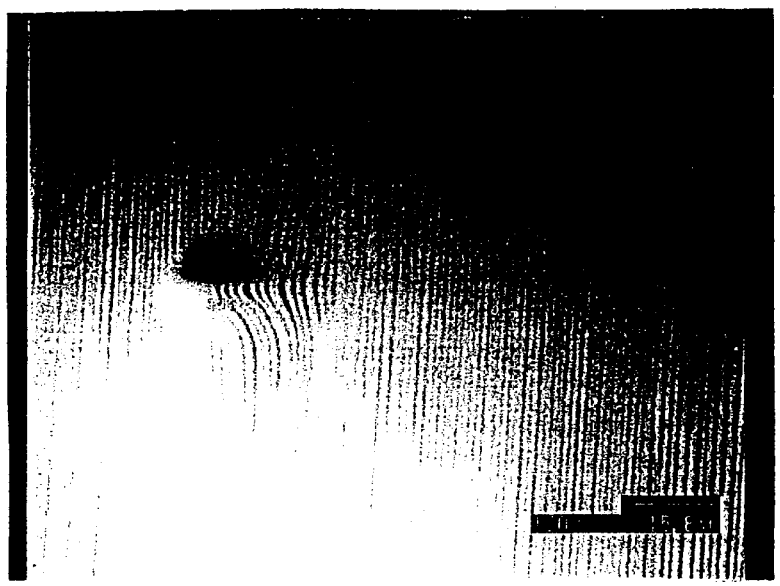
FIGS. 10A and 10B are laser microscope photographs of the respective surfaces of a SiC thin film used for the substrate of a semiconductor device according to the present invention and a SiC thin film formed by a conventional method.
Figure 10B:
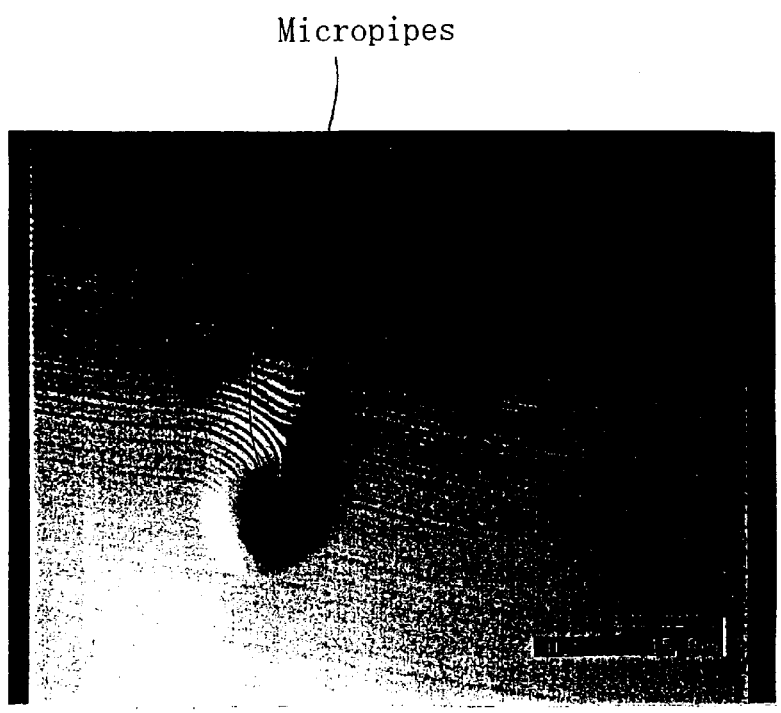
Figure 11:
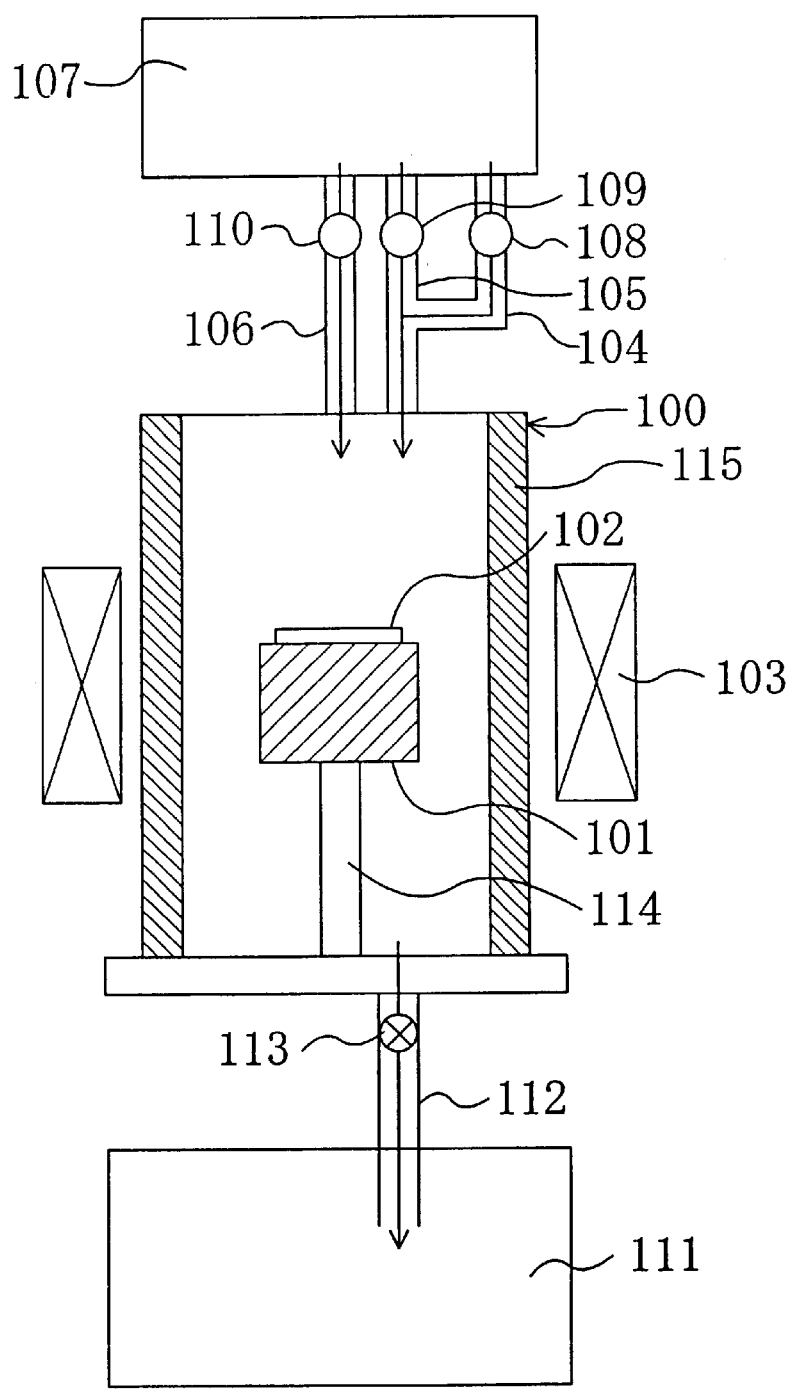
FIG. 11 is a schematic view of a conventional apparatus for growing a SiC thin film.
Figure 12:
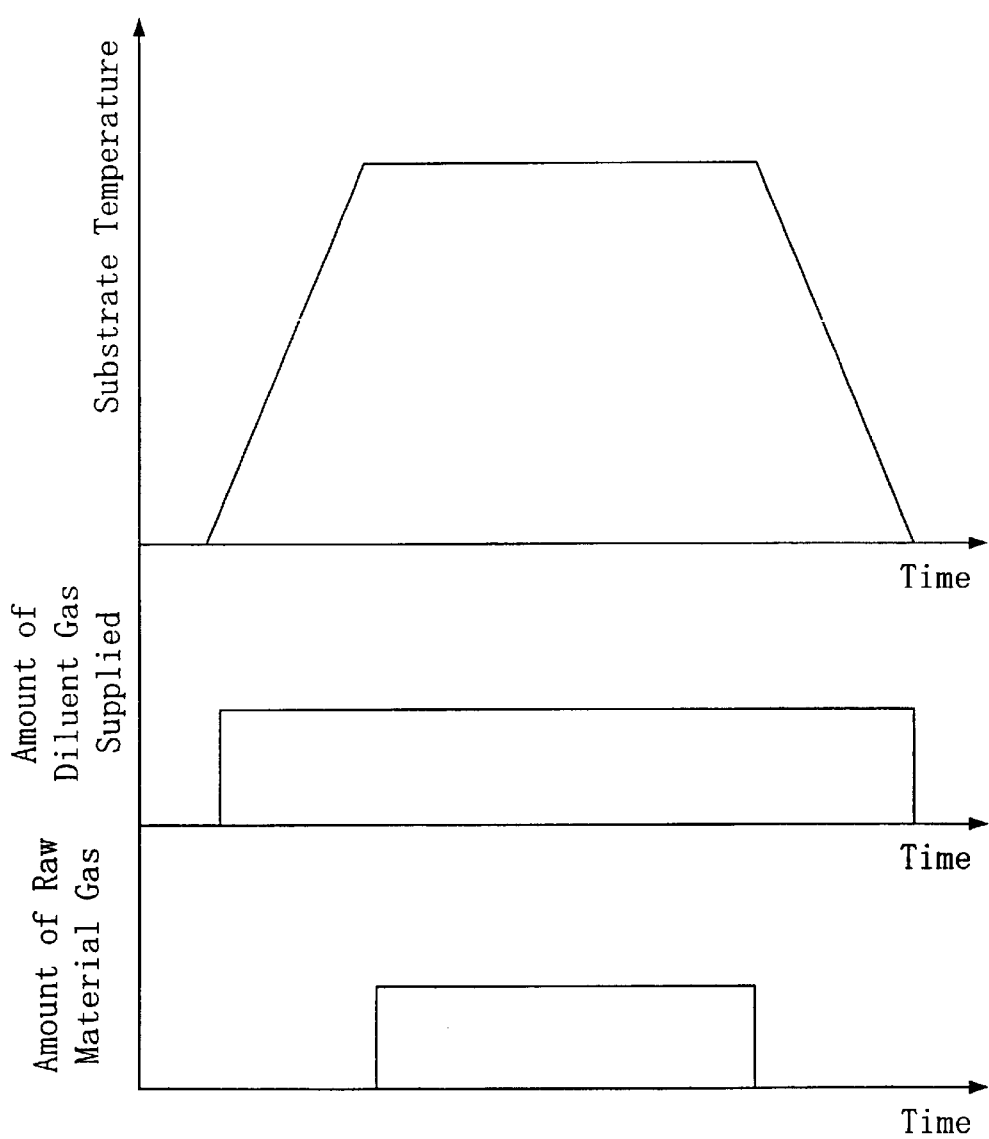
FIG. 12 shows a process in which the respective flow rates of a raw material gas and a diluent gas and the temperature of a substrate vary with time in accordance with the conventional method for growing a SiC thin film.

FIGS. 10A and 10B are respective photographs obtained by shooting the surface of the thin film grown in the present embodiment and the surface of a SiC thin film grown without introducing nitrogen by using a laser microscope. Micropipe defects were observed in the surface of the SiC thin film grown without introducing nitrogen (see FIG. 10B), while extinct micropipe defects were observed in the surface of the SiC thin film formed in the present embodiment (see FIG. 10A). Thus, it was proved that the density of the micropipe defects in the SiC thin film formed in the present embodiment was reduced significantly. In contrast to the density of the micropipe defects in the surface of the SiC thin film grown without introducing nitrogen, which was about $90/cm^2$, and not so different from the density thereof (about $100/cm^2$) in the surface of the base substrate, the density of the micropipe defects in the SiC thin film formed by the method for growing a SiC thin film according to the present embodiment was about $30/cm^2$. The results indicate that micropipe defects in a SiC thin film can be reduced by using the method for growing a SiC thin film according to the present embodiment.

There can be considered two factors which suppressed the growth of the micropipe defects in the SiC thin film in the present embodiment. One of them is the influence of an impurity, such as nitrogen, introduced into the SiC crystal. Since the micropipe defects are assumedly caused by the overlapping of screw dislocations in the SiC crystal, the introduction of nitrogen atoms larger than carbon atoms transforms the micropipe defects into plane defects, with the result that the growth of the micropipe defects is suppressed.

The other factor is the influence of the impurity doped layers used newly in the present invention. The present inventors have assumed that crystal distortion is present at the interfaces between the impurity doped layers each containing nitrogen at a high concentration and the undoped layers and the distortion suppresses the growth of the micropipe defects. Hence, the present inventors have considered that it is efficient to use the multilayer structure consisting of the impurity doped layers and the undoped layers in suppressing the growth of the micropipe defects.

In the fabrication of a SiC substrate, a sublimation process in which SiC is sublimated under vacuum and then recrystallized is used frequently. However, the sublimation process cannot provide such sharp variations in impurity concentration as obtained in the present embodiment because of a high crystal growing speed. For this reason, the present embodiment uses a CVD process to grow a SiC crystal.

The following is the procedure for forming the Schottky diode according to the present embodiment.

As the substrate 35 for device, a SiC substrate having the aforementioned SiC thin film, i.e., a SiC substrate formed with the suppression layer for preventing the extension of the micropipe defects is used.

First, the substrate 35 for device is placed in the crystal growing apparatus shown in FIG. 7. By performing the foregoing CVD process using the crystal growing apparatus, the undoped layers 36 each having a thickness of about 50 nm and the undoped layers 37 each having a thickness of about 10 nm are alternately grown epitaxially on the substrate 35 for device, thereby forming the active region 40. Thereafter, a silicon dioxide film is formed on the substrate and partly opened to form the guard ring 31. Then, the ohmic electrode 33 composed of a Ni alloy is formed on the lower surface of the substrate 35 for device, while the Schottky electrode 32 composed of a Ni alloy is formed in and over the opened region of the guard ring 31, whereby the Schottky diode according to the present embodiment is formed.

Although the five undoped layers and the five doped layers are formed alternately on the base substrate 3b in the substrate 35 for device of the Schottky diode according to the present embodiment, the numbers of the undoped layers and the doped layers are not particularly limited. Irrespective of the numbers of the undoped layers and the doped layers, the effect of suppressing the growth of the micropipe defects can be achieved. Even if only one undoped layer and only one doped layer are provided, a sharp variation in nitrogen concentration may achieve the effect of suppressing the growth of micropipe defects. Preferably, about five undoped layers and about five doped layers are stacked alternately because electric resistance is increased disadvantageously if the multilayer portion is excessively thick.

Although the thickness of each of the undoped layers in the substrate 35 for device has been adjusted to 100 nm in the present embodiment, the thickness thereof is preferably in the range of 10 nm to 1000 nm. Although the thickness of each of the doped layers has been adjusted to 20 nm, the thickness thereof is preferably in the range of 10 nm to 1000 nm, similarly to the thickness of the undoped layer. This is because, if the thickness of the doped layer is smaller than 10 nm, the impurity cannot perform the function of preventing the micropipe defects and, if the thickness of the doped layer is over 1000 nm, the impurity (which is nitrogen in the present embodiment) in the doped layer may degrade the crystalline property of the SiC thin film. The doped layer is preferably thinner than the undoped layer. This is because the undoped layer thicker than the doped layer is required to suppress lattice distortion or the like resulting from a lattice mismatch occurring in a SiC layer into which an impurity element has been introduced.

Although the concentration of nitrogen introduced into the doped layer is $1 \times 10^{18}$ atoms cm$^{-3}$ in the present embodiment, the concentration may be increased to about $1 \times 10^{19}$ atoms cm$^{-3}$ by elongating the period during which the pulse valve is opened.

Accordingly, the effect of suppressing the micropipe defects can further be enhanced.

Although the present embodiment has used nitrogen as an impurity to be introduced into the doped layer, it is also possible to introduce another impurity such as P, Al, B, or Ne into the doped layer by using a gas containing P, Al, B, or Ne.

Since the density of micropipe defects in the undoped SiC layer of the substrate 35 for device is much lower than in the conventional SiC substrate, the density of micropipe defects in the SiC layer deposited on the substrate is also lower. This improves the crystalline property of the active region of the Schottky diode according to the present embodiment and allows the formation of a Schottky diode having characteristics including a high breakdown voltage.

Thus, the thin film growing method according to the first embodiment has provided a substrate containing micropipe defects at a reduced density. The use of the substrate eliminates a device containing micropipe defects in the active region thereof and increases a production yield during device fabrication.

In the Schottky diode according to the present embodiment, a current flows in a direction perpendicular to the substrate plane. Although the lower portion of the substrate contains micropipe defects at a relatively high density, the presence of the micropipe defects hardly affects the performance of the device if the lower portion of the substrate functions only as a current path.

Although the present embodiment has formed the active region 40 on the substrate (substrate 35 for device) comprising the suppression layer 30 for suppressing the growth of micropipes and the undoped SiC layer 24, a Schottky diode may also be formed by using the undoped SiC layer in the substrate 35 for device as an active region.

Embodiment 2

A second embodiment of the present invention is a Schottky diode produced by using the same substrate 35 for device as the SiC substrate used for the Schottky diode according to the first embodiment. The Schottky diode according to the second embodiment is different from the Schottky diode according to the first embodiment in that a current flows in parallel to the substrate plane.

Figure 3:
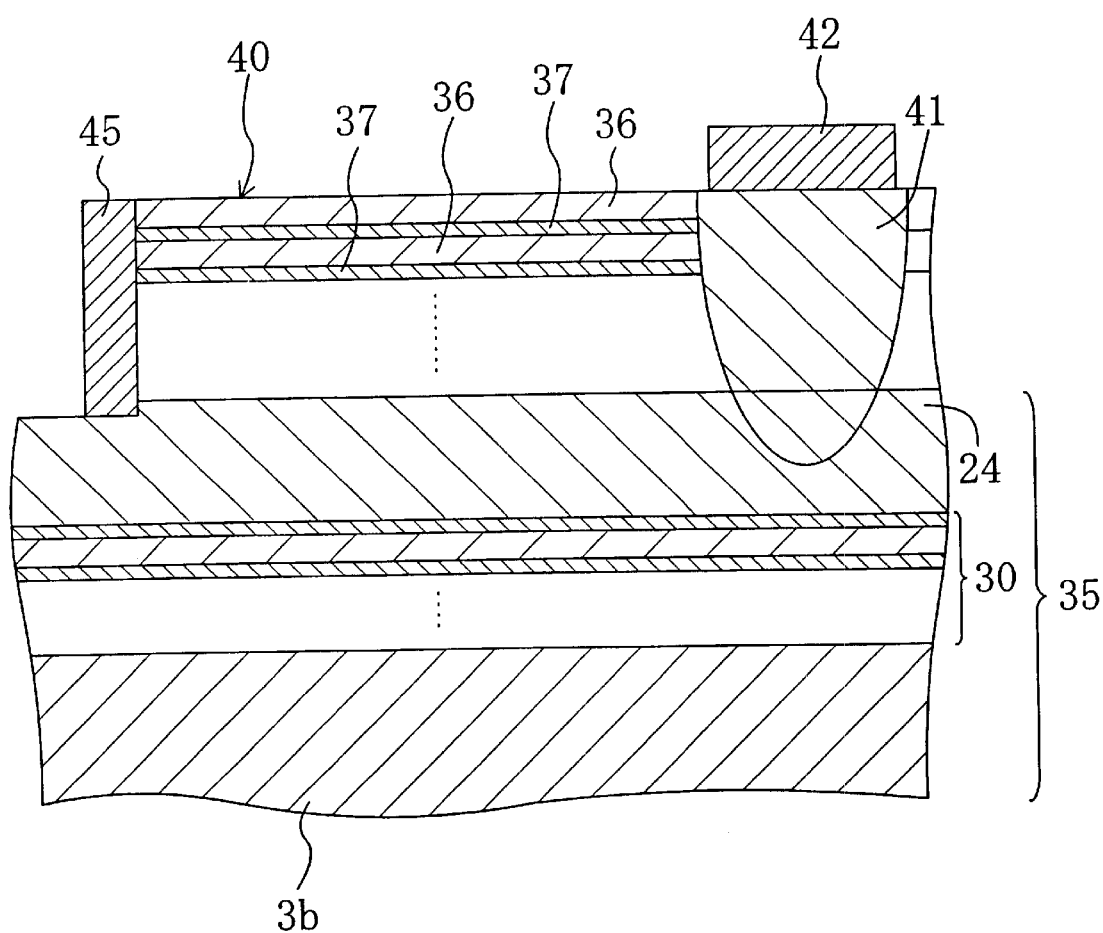
FIG. 3 is a cross-sectional view of a Schottky diode according to a second embodiment of the present invention.

FIG. 3 is a cross-sectional view showing a schematic structure of the Schottky diode as a power semiconductor device according to the second embodiment.

As shown in the drawing, an active region 40 composed of fifty undoped layers 36 and fifty n-type doped layers 37 (δ-doped layers) which are stacked alternately and formed in the same method as described in the first embodiment is provided on the principal surface of a substrate 35 for device which is an n-type 4H-SiC substrate. As the substrate 35 for device, the present embodiment uses a substrate having the suppression layer 30 for preventing the growth of micropipes used in the first embodiment. The thickness of the substrate is about 100 μm. The undoped SiC layer of the substrate 35 for device has not been doped with an impurity and is in a nearly semi-insulating state. The thickness of each of the n-type doped layers 37 is about 2 nm and the peak concentration of nitrogen in the n-type doped layer 37 is $1 \times 10^{18}$ atoms cm$^{-3}$. The thickness of each of the undoped layers 36 is about 50 nm and a nitrogen concentration in the undoped layer 36 is about $5 \times 10^{15}$ atoms cm$^{-3}$.

In the present embodiment, a Schottky electrode 45 is provided not on the active region 40 but on one side of the active region 40. Specifically, a groove reaching the substrate 35 for device is formed in the active region 40 and the Schottky electrode 45 made of a Ni alloy is provided to make a Schottky contact with the portion of the active region 40 forming one side surface of the groove. In other words, the Schottky electrode 45 is provided to make a Schottky contact with the first side surface of each of the undoped layers 36 and the n-type doped layers 37 of the active region 40. On the other hand, a withdrawn doped layer 41 is formed in opposing relation to the Schottky electrode 45 with the active region 40 interposed therebetween. The withdrawn doped layer 41 into which an impurity has been introduced at a high concentration is located in the area of the active region 40 at a given distance from the first side surface of each of the undoped layers 36 and the n-type doped layers 37 of the active region 40. The withdrawn doped layer 41 has been formed by implanting nitrogen ions into the respective portions of the active region 40 and the substrate 35 for device and a nitrogen concentration in the withdrawn doped layer 41 is about $1 \times 10^{18}$ atoms cm$^{-3}$. An ohmic electrode 42 made of a Ni alloy is provided on the withdrawn doped layer 41 to make an ohmic contact therewith. The distance between the Schottky electrode 45 and the withdrawn doped layer 41 is about 10 μm. Thus, the ohmic electrode 42 is connected to the second side surface of each of the undoped layers 36 and the n-type doped layers 37 of the active region 40 via the withdrawn doped layer 41.

The withdrawn doped layer 41 need not necessarily be provided. It is also possible to provide an ohmic electrode making a direct ohmic contact with the active region by performing the process of, e.g., forming a trench in the active region 40, filling an electrode material (such as Ni) in the trench, and providing an ohmic contact between the active region 40 and the electrode material.

The following is the procedure for forming the Schottky diode shown in FIG. 3 according to the present embodiment.

First, as the substrate 35 for device, a SiC substrate which is the same as used in the first embodiment, i.e., a substrate having the suppression layer 30 for preventing the extension of micropipe defects and the undoped SiC layer 24 formed on the base substrate 3b is used. The substrate 35 for device is placed in the crystal growing apparatus shown in FIG. 7. The undoped layers 36 each having a thickness of about 50 nm and the n-type doped layers 37 each having a thickness of about 2 nm are alternately grown epitaxially on the substrate 35 for device by performing the CVD process described in the first embodiment, thereby forming the active region 40. Then, the withdrawn doped layer 41 is formed by implanting nitrogen ions into the respective portions of the active region 40 and the substrate 35 for device, while the groove is formed by partly removing the active region 40 by dry etching. Thereafter, the ohmic electrode 42 made of a Ni alloy is formed on the withdrawn doped layer 41. Subsequently, the Schottky electrode 45 made of a Ni alloy is formed on the sidewall of the groove, whereby the Schottky diode according to the present embodiment is formed.

Since the density of micropipe defects in the undoped SiC layer of the SiC substrate used in the present embodiment is much lower than in the conventional SiC substrate, the density of micropipe defects in the SiC layer deposited on the substrate is also lower. This improves the crystalline property of the active region of the Schottky diode according to the present embodiment and allows the formation of a Schottky diode having characteristics including a high breakdown voltage.

Thus, the thin film growing method according to the first embodiment has provided a substrate containing micropipe defects at a reduced density. The use of the substrate eliminates a device containing micropipe defects in the active region thereof and increases a production yield during device fabrication.

Although the present embodiment has formed the active region 40 on the substrate (substrate 35 for device) having the suppression layer, which is the same as used in the first embodiment, a Schottky diode may also be formed by using the undoped SiC layer of the substrate 35 for device as an active region.

Embodiment 3

Figure 4A:
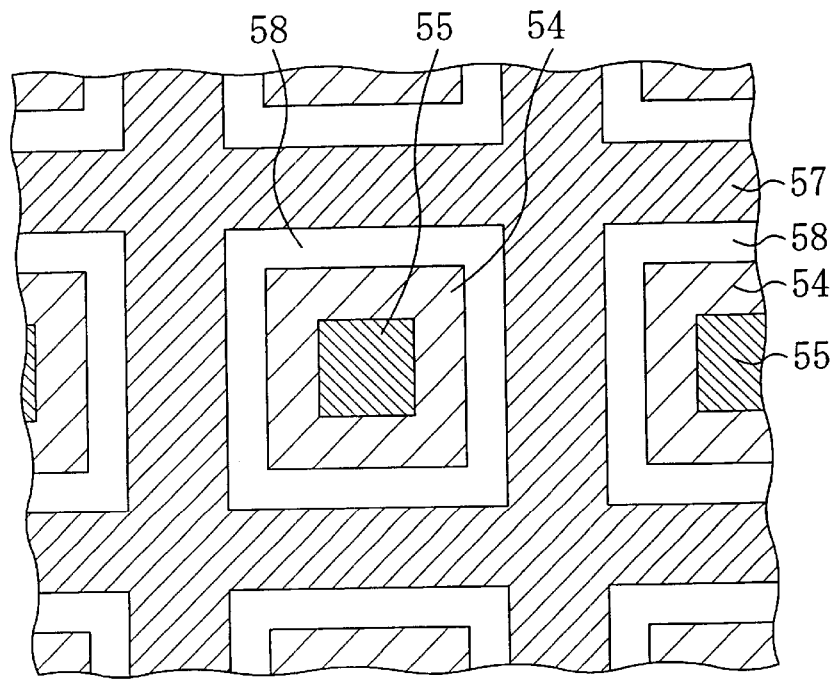
FIG. 4A is a top view of a vertical MOSFET according to a third embodiment of the present invention and FIG. 4B is a cross-sectional view thereof.
Figure 4B:
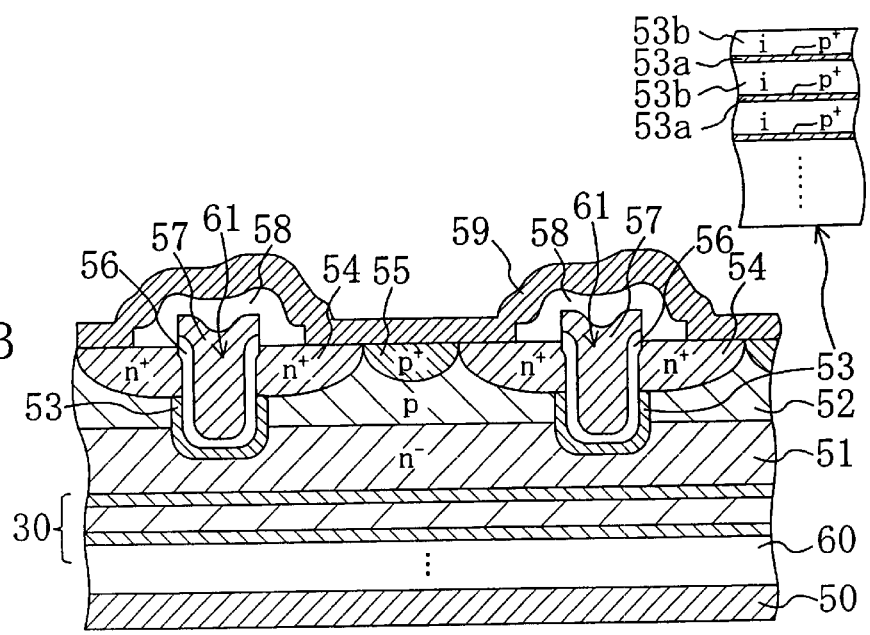

FIG. 4A is a plan view of a vertical power MOSFET according to a third embodiment of the present invention and FIG. 4B is a cross-sectional view thereof. It is to be noted that FIG. 4A shows a plane state in which a source electrode 59 has been removed and an interlayer insulating film 58 is treated as a transparent member.

As shown in FIGS. 4A and 4B, the vertical power MOSFET according to the present embodiment has a structure in which a large number of cells are arranged as a matrix.

As a substrate, the present embodiment uses a SiC base substrate 3b provided with a suppression layer 30 for preventing the extension of micropipe defects. Hereinafter, the SiC base substrate will be referred to as a SiC substrate 60. An undoped SiC layer on a multilayer structure consisting of doped layers (δ-doped layers) and undoped layers contains an n-type impurity. The power MOSFET according to the present embodiment comprises: the SiC substrate 60; an n⁻-type SiC layer 51 formed on the SiC substrate 60 and doped with nitrogen at a concentration of about $2\times10^{17}$ atoms cm$^{-3}$; a p-type SiC layer 52 formed on the n⁻-type SiC layer 51 and doped with nitrogen at a concentration of about $1\times10^{16}$ atoms cm$^{-3}$; an n⁺-type source region 54 formed in the p-type SiC layer 52 by ion implantation and containing aluminum at a concentration of about $1\times10^{18}$ atoms cm$^{-3}$; a p⁺-type contact region 55 formed by ion implantation in an area of the p-type SiC layer 52 sandwiched between the respective source regions 54 of two cells and containing aluminum at a concentration of about $1\times10^{18}$ atoms cm$^{-3}$; a trench 61 penetrating the p-type SiC layer 52 and reaching the n⁻-type SiC layer 51; an active region 53 formed along the side surfaces and bottom surface of the trench 61 and composed of a multilayer film consisting of δ-doped layers and undoped layers and containing aluminum at a mean concentration of about $2\times10^{17}$ atoms cm$^{-3}$; a gate insulating film 56 made of SiO$_2$ deposited on the active region 53; a gate electrode 57 made of polysilicon deposited on the gate insulating film 56; an interlayer insulating film 58 covering the gate electrode 57; a source electrode 59 made of a Ni alloy film covering the upper surface of the substrate and making contact with each of the n⁺-type source region 54 and p⁺-type contact region 55 of each of the cells; and a drain electrode 50 made of a Ni alloy film covering the back surface of the SiC substrate 60.

The active region 53 is composed of a multilayer structure consisting of five p-type doped layers 53a each containing aluminum at a high concentration (e.g., $1\times10^{18}$ atoms cm$^{-3}$) and having a thickness of about 10 nm and five undoped layers 53b each made of an undoped SiC single crystal and having a thickness of about 50 nm, which are alternately stacked. Accordingly, the total thickness of the active region 53 is about 300 nm. Since each of the p-type doped layers 53a is formed sufficiently thin to allow the spreading out of carriers into the undoped layers 53b under a quantum effect, negative charges are trapped in the p-type doped layer 53a as carriers spread out.

In the vertical power MOSFET according to the present embodiment, if a voltage is applied between the drain electrode 50 and the source electrode 59 with a bias being applied to the polysilicon gate electrode 57, carriers (electrons) flow in the active region 53 interposed between the gate insulating film 56 and each of the p-type SiC layer 52 and the n⁻-type SiC layer 51. The voltage applied to the gate electrode 57 modulates a source-to-drain current and enables a switching operation.

A description will be given herein below to a method for fabricating the vertical power MOSFET according to the present embodiment.

First, the n⁻-type SiC layer 51 is grown epitaxially on the SiC substrate 60 by CVD using the crystal growing apparatus shown in FIG. 7, while the n⁻-type SiC layer 51 is doped with nitrogen at a concentration of $2\times10^{17}$ atoms cm$^{-3}$ by in-situ doping. Thereafter, the p-type SiC layer 52 is grown epitaxially, while it is doped with aluminum at a concentration of $1\times10^{16}$ atoms cm$^{-3}$ by in-situ doping.

Then, an etching mask composed of a silicon dioxide film and a Ni film and having an opening corresponding to a region to be formed with a trench is formed. By performing reactive ion etching using CF$_4$ and O$_2$, the trench 61 penetrating the p-type SiC layer 52 and reaching the midway portion of the n⁻-type SiC layer 51 is formed.

Then, the active region 53 composed of the multilayer structure consisting of the five p-type doped layers 53a and the five undoped layers 53b which are alternately stacked is formed in accordance with the procedure described in the first embodiment. The mean aluminum concentration in the active region 53 is about $1\times10^{17}$ atoms cm$^{-3}$ and the total thickness of the active region 53 is 300 nm.

Subsequently, the surface portion of the active region 53 is thermally oxidized at a temperature of about 1100° C. so that a thermal oxidation film is formed. A polysilicon film is further deposited on the thermal oxidation film. After that, the thermal oxidation film and the polysilicon film are patterned to form the gate insulating film 56 and the polysilicon gate electrode 57 to be buried in the trench 61. At that time, parts of the thermal oxidation film and the polysilicon film are left on the middle portion between the two cells to serve as an ion implantation mask. Then, nitrogen ions ($N^+$) are implanted into the p-type SiC layer 52 from above the gate electrode 57 and the ion implantation mask, whereby the $n^+$-type source region 54 containing nitrogen at a concentration of $1\times10^{18}$ atoms $cm^{-3}$ is formed.

Thereafter, only the ion implantation mask is removed. Then, the interlayer insulating film 58 composed of a silicon dioxide film is deposited on the substrate and a region thereof covered with the ion implantation mask is opened. Subsequently, aluminum ions ($Al^+$) are implanted into the p-type SiC layer 52 from above the interlayer insulating film 58, whereby the $p^+$-type contact region 55 containing aluminum at a concentration of $1\times10^{18}$ atoms $cm^{-3}$ is formed.

After that, only the portion of the interlayer insulating film 58 located over the part of the $n^+$-source region 54 is etched away. Then, a Ni alloy film is vapor deposited on the upper and lower surfaces of the substrate to form the source and drain electrodes 59 and 50. As a result of the foregoing procedure, the power MOSFET according to the present embodiment is produced.

Since the present embodiment has used, as the SiC substrate 60, the base substrate 3b having the suppression layer 30 for preventing the extension of micropipes, the density of micropipe defects in the active layer formed on the suppression layer 30 is much lower than in the SiC substrate produced in accordance with the conventional method. Consequently, the density of micropipe defects in the SiC layer deposited on the substrate is also lower. This improves the crystalline property of the active region of the power MOSFET according to the present embodiment and allows the formation of a power MOSFET having characteristics including a high breakdown voltage.

Thus, the thin film growing method according to the first embodiment has provided a substrate containing micropipe defects at a reduced density. The use of the substrate eliminates a device containing micropipe defects in the active region thereof and increases a production yield during device fabrication.

In the power MOSFET according to the present embodiment, a current flows in a direction vertical to the substrate plane. Although the lower portion of the substrate contains micropipe defects at a relatively high density, the presence of the micropipe defects hardly affects the performance of the device if the substrate functions only as a current path.

Embodiment 4

Figure 5:
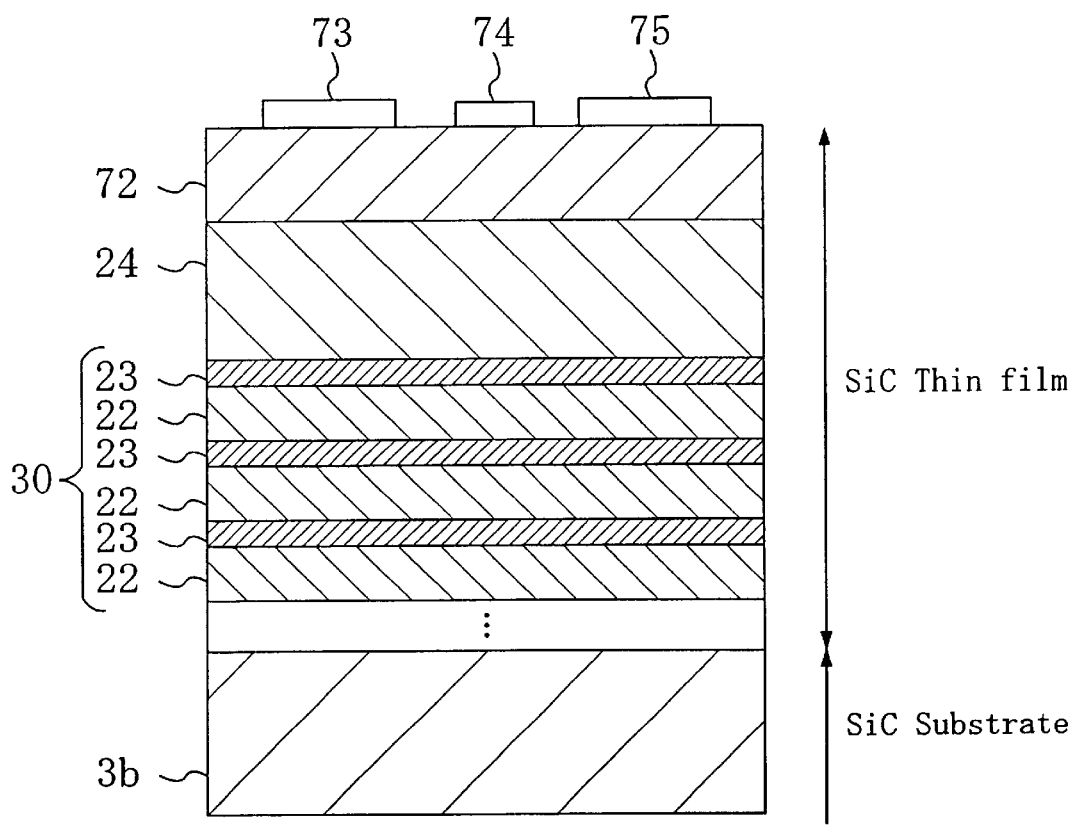
FIG. 5 is a cross-sectional of a MESFET according to a fourth embodiment of the present invention.

FIG. 5 is a schematic cross-sectional view of a MESFET according to a fourth embodiment of the present invention. The MESFET according to the present embodiment uses a SiC substrate, which is the same as used in the first embodiment, i.e., a SiC substrate formed with a suppression layer for preventing the extension of micropipe defects and with an undoped SiC layer.

The SiC substrate is composed of: a base substrate 3b made of SiC; a suppression layer 30 composed of a multilayer structure consisting of five undoped layers 22 and five impurity doped layers 23 which are alternately stacked; and an undoped SiC layer 24 with a thickness of 3 $\mu$m.

As shown in FIG. 5, the MESFET according to the present embodiment comprises: the SiC substrate; a SiC thin film (channel layer 72) which is an n-type doped layer with a thickness of about 200 nm (2000 Å) formed on the SiC substrate; a gate electrode 74 made of gold (Au) formed on the channel layer 72 to make a Schottky contact therewith and having a gate length of about 0.5 $\mu$m; and source and drain electrodes 73 and 75 made of Ni and provided on both sides of the gate electrode not to make contact with the gate electrode 74 but to make an ohmic contact with the channel layer 72. The channel layer 72 contains an impurity serving as carriers at a concentration of $2\times10^{17}$ atoms $cm^{-3}$ and functions as the channel layer of the MESFET.

A description will be given herein below to a method for fabricating the MESFET according to the present embodiment.

First, the channel layer 72 which is an n-type doped layer with a thickness of about 200 nm is formed by CVD on the substrate. At that time, an impurity has been introduced into the channel layer to achieve a carrier concentration of $2\times10^{17}$ atoms $cm^{-3}$.

Then, nickel (Ni) is vapor deposited on the upper surface of the channel layer 72 by using a vacuum evaporation system to form the source and drain electrodes 73 and 75. Subsequently, annealing is performed at 1000° C. for 3 minutes to provide an ohmic contact.

Then, gold (Au) is vapor deposited on the upper surface of the channel layer 72 to form the gate electrode 74 having a gate length of about 0.5 $\mu$m and thereby provide a Schottky contact between the gate electrode 74 and the channel layer 72, whereby the MESFET according to the present embodiment is formed. To evaluate the performance of the MESFET, the relationship between drain current and gate voltage was examined. For a comparison, a similar MESFET having a SiC thin film unformed with the doped layer 23 was formed and the current-to-voltage characteristic thereof was examined. The MESFET formed had a thickness of about 200 nm (2000 Å), a carrier concentration of $2\times10^{17}$ atoms $cm^{-3}$, and a gate length of about 0.5 $\mu$m so that the two MESFETs have nearly the same carrier concentrations and the channel layers having nearly the same thicknesses. Under the conditions, the respective transconductances of the two MESFETs in the vicinity of the threshold voltages were measured. As a result, it was found that the transconductance of the MESFET using the SiC thin film formed with the impurity doped layer in a multilayer structure was about double the transconductance of the MESFET using the SiC thin film grown without forming the doped layer 23.

This may be because the SiC thin film on the substrate used in the present embodiment had an improved crystalline property due to micropipe defects at a reduced density and therefore the mobility of carriers flowing in the channel layer had increased.

The results show that the use of the substrate having the suppression layer 30 for preventing the growth of micropipe defects allows the formation of a MESFET having the characteristics of lower power consumption, low-voltage driving, and high gain.

Thus, the thin film growing method according to the first embodiment has provided a substrate containing micropipe defects at a reduced density, i.e., the base substrate 3b having the suppressing layer 30 and the undoped SiC layer 24. The use of the substrate eliminates a device containing micropipe defects in the active region thereof and increases a production yield during device fabrication.

Although the present embodiment has fabricated the MESFET using the n-type doped layer as the channel layer, a MESFET having an impurity doped layer 23 and a channel layer 72 each containing a p-type impurity may also be fabricated. Alternatively, it is also possible to fabricate a horizontal MISFET having a gate insulating film provided on a channel layer 72.

Although the present embodiment has formed the channel layer 72 on the undoped SiC layer 24, a multilayer portion 80 composed of two or more undoped layers 76 each having a thickness of about 100 nm and two or more δ-doped layers 77 each having a thickness of about 20 nm which are alternately stacked on the undoped SiC layer 24 may also be formed instead.

Figure 6:
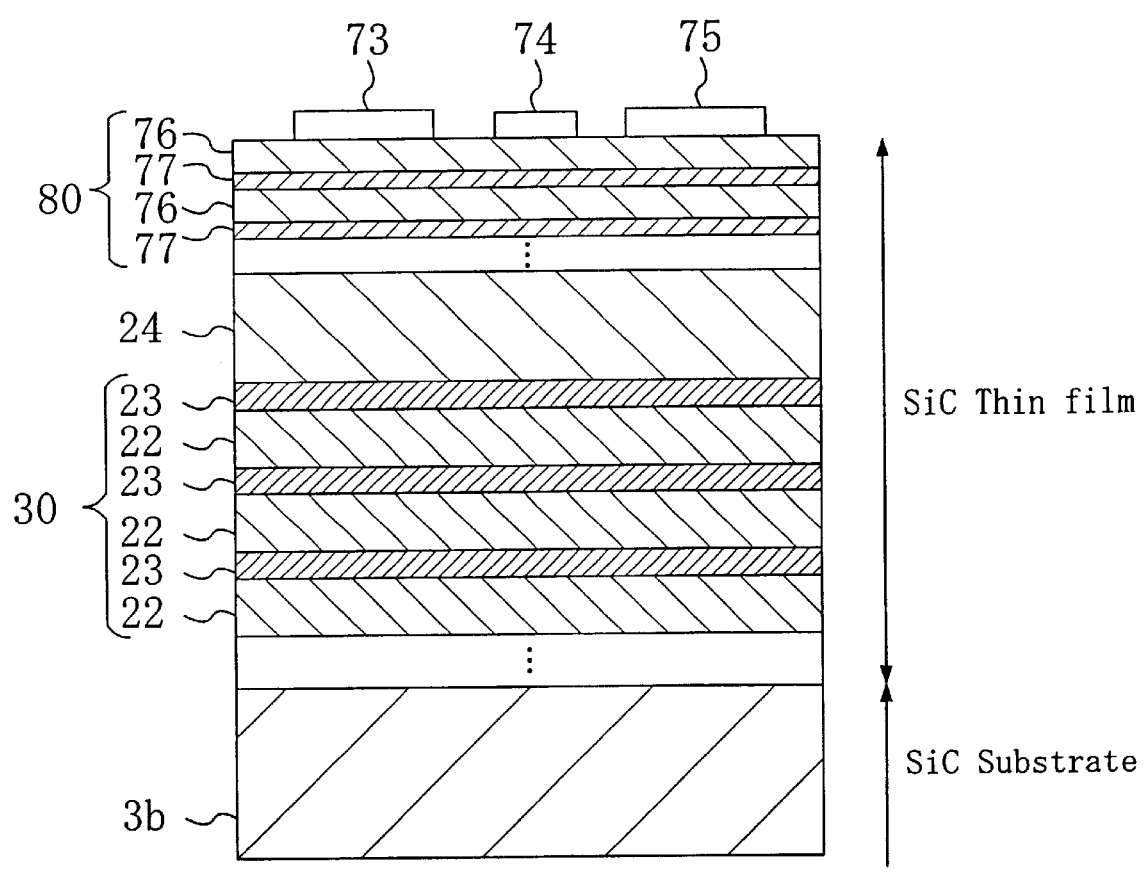
FIG. 6 is a cross-sectional view of a MESFET having a channel layer composed of a suppression layer consisting of impurity doped layers and undoped layers according to a fourth embodiment of the present invention.

FIG. 6 is a schematic cross-sectional view of a MESFET provided with the multilayer portion 80 in place of the channel layer 72 according to the present embodiment.

By using the multilayer portion 80 as an active region, the carrier mobility can be increased so that the performance of the MESFET is improved.

What is claimed is:

1. A semiconductor device comprising:
    a SiC substrate;
    a suppression layer formed on the SiC substrate, the suppression layer including at least one high-concentration SiC layer containing an impurity at a high concentration and having the function of preventing extension of a micropipe; and
    an active region formed on the suppression layer.

2. The semiconductor device of claim 1, wherein the suppression layer further includes:
    at least one low-concentration SiC layer containing an impurity at a concentration lower than in the high-concentration SiC layer and
    the high-concentration SiC layer and the low-concentration SiC layer are formed in alternately stacked relation.

3. The semiconductor device of claim 1, wherein the active region includes:
    at least one first SiC layer functioning as a carrier flow region; and
    at least one second SiC layer containing an impurity for carriers at a concentration higher than in the first SiC layer, smaller in thickness than the first SiC layer, and allowing the carriers to be spread out into the first SiC layer under a quantum effect and
    the first SiC layer and the second SiC layer are formed in alternately stacked relation.

* * * * *

UNITED STATES PATENT AND TRADEMARK OFFICE
CERTIFICATE OF CORRECTION

PATENT NO.    : 6,600,203 B2
DATED         : July 29, 2003
INVENTOR(S)   : Takahashi et al.

It is certified that error appears in the above-identified patent and that said Letters Patent is hereby corrected as shown below:

Title page,
Item [75], Inventors, "Kunimasa Takahashi, Ibaraki" should read -- Kunimasa Takahashi, Osaka --; Masao Uchida, Ibaraki" should read -- Masao Uchida, Osaka --; and "Kenya Yamashita, Kadoma" should read -- Kenya Yamashita, Osaka --.

Signed and Sealed this

Twentieth Day of April, 2004

JON W. DUDAS
*Acting Director of the United States Patent and Trademark Office*